United States Patent [19]

Chung

[11] Patent Number: 5,760,436
[45] Date of Patent: Jun. 2, 1998

[54] EEPROM CELL AND PROCESS FOR FORMATION THEREOF

[75] Inventor: Seong-Woo Chung, Chungcheongbuk-Do, Rep. of Korea

[73] Assignee: LG Semicon Co., Ltd., Chungcheongbuk-Do, Rep. of Korea

[21] Appl. No.: 729,292

[22] Filed: Oct. 10, 1996

Related U.S. Application Data

[62] Division of Ser. No. 568,621, Dec. 7, 1995, Pat. No. 5,643,814.

[30] Foreign Application Priority Data

Dec. 7, 1994 [KR] Rep. of Korea .................. 94-33046

[51] Int. Cl.$^6$ .................. H01L 29/76; H01L 29/788
[52] U.S. Cl. .................. 257/314; 257/315; 257/316
[58] Field of Search .................. 257/314–322; 365/185

[56] References Cited

U.S. PATENT DOCUMENTS

| | | | |
|---|---|---|---|
| 3,984,822 | 10/1976 | Simko et al. | 257/316 |
| 4,698,787 | 10/1987 | Mukherjee et al. | 257/315 |
| 4,998,220 | 3/1991 | Eitan et al. | 257/321 |
| 5,070,032 | 12/1991 | Yuan et al. | 437/43 |
| 5,196,722 | 3/1993 | Bergendahl et al. | 257/320 |
| 5,268,319 | 12/1993 | Harari | 257/320 |
| 5,386,132 | 1/1995 | Wong | 257/320 |
| 5,467,305 | 11/1995 | Bertin et al. | 257/320 |
| 5,495,441 | 2/1996 | Hong | 257/320 |

FOREIGN PATENT DOCUMENTS 59-61188 (A) 4/1984 Japan.

OTHER PUBLICATIONS

"A New Flash E$^2$PROM Cell Using Triple Polysilicon Technology," H. Masuoka, *International Electron Devices Meeting 1984 Technical Digest*, Dec. 1984, pp. 464–467.

*Primary Examiner*—Stuart S. Levy
*Assistant Examiner*—Adriana Giordana

[57] ABSTRACT

A flash EEPROM cell structure and a method for forming it. The method of forming the EEPROM cell includes the steps of: forming a plurality of trenches on a substrate, the trenches being filled with an insulating layer; forming bit lines between the trenches and on the substrate; forming an insulating layer on the bit lines; forming a floating gate, with at least one side of it contacting with the bit lines; and simultaneously forming a control gate and an erasing gate. The control gate and the erasing gate cross the bit lines and the floating gate. The erasing gate also extends over the trenches. The floating gate and the erasing gate extend down into the trenches.

9 Claims, 7 Drawing Sheets

F I G. 1B
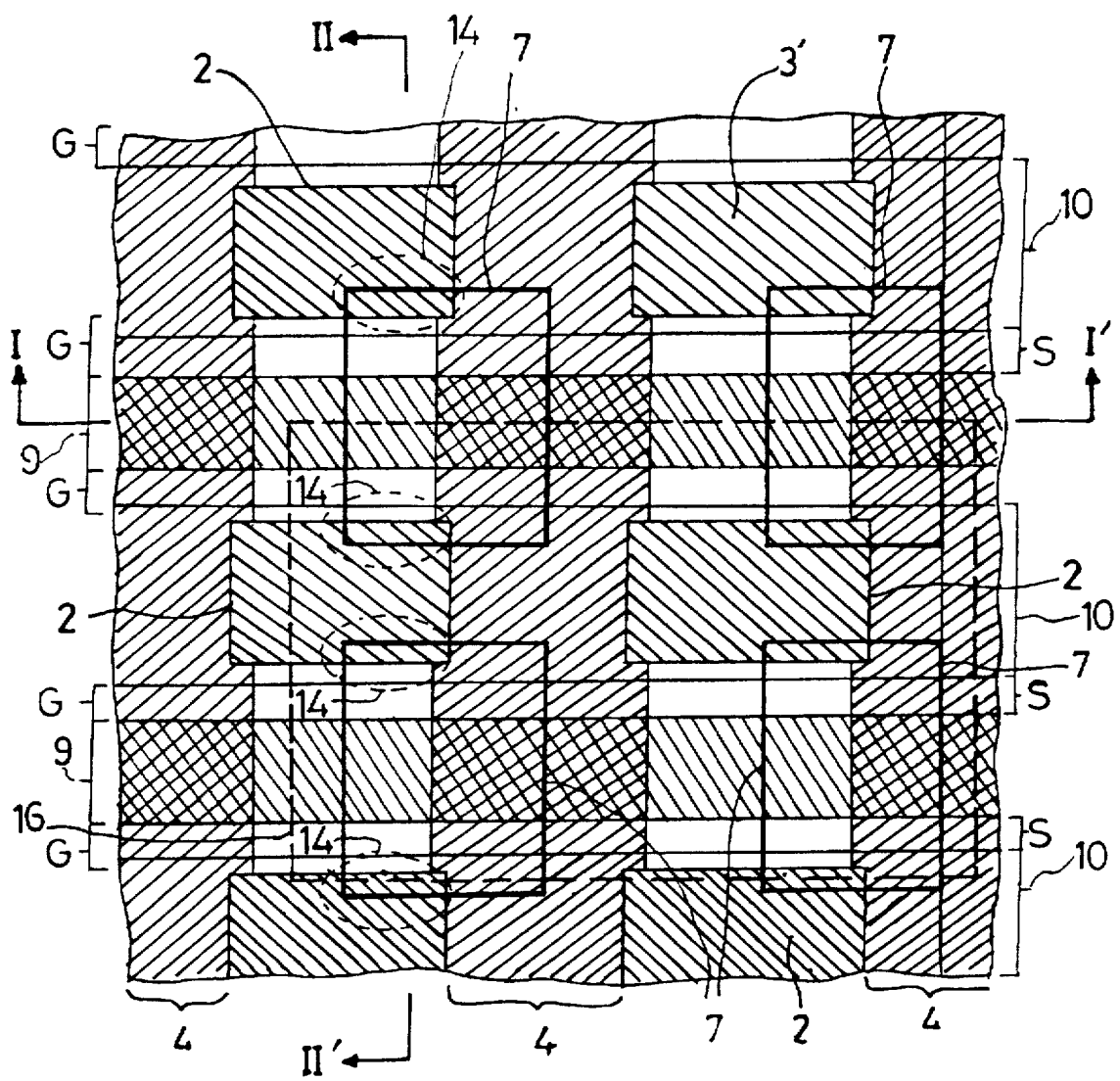

5,760,436

1

EEPROM CELL AND PROCESS FOR FORMATION THEREOF

This application is a divisional of application Ser. No. 08/568,621, filed on Dec. 7, 1995, now U.S. Pat. No. 5,643,814, the entire contents of which are hereby incorporated by reference.

FIELD OF THE INVENTION

The present invention relates to an EEPROM cell and a process for the formation thereof, and particularly to a flash EEPROM cell structure and a process for the formation thereof, in which the processes of forming a control gate, a floating gate and an erasing gate are simplified, the topology of the wafer is improved, and the size of the cell is reduced.

BACKGROUND OF THE INVENTION

There are many kinds of flash EEPROM cells, and one example of them is illustrated in FIGS. 3A–3C.

FIG. 3A illustrates a conventional EEPROM cell having a simple stacked type gate structure. As shown in this drawing, a control gate 31 and a floating gate 32 are formed by utilizing two layers of polysilicon, and source and drain regions 33 are formed on the opposite sides of the floating gate. A channel region is formed between the source and drain regions, and is covered by the floating gate. The EEPROM cell of such type is disclosed in U.S. Pat. Nos. 3,984,822 and 4,698,787.

FIG. 3B illustrates another conventional EEPROM cell in which a split gate structure is provided. In this EEPROM cell, a control gate 34 and a floating gate 35 are formed by utilizing two layers of polysilicon, like the simple stacked gate structure. However, a difference is seen in that the floating gate 35 covers only a part of the channel region, and that source and drain regions 36 are formed on a side of the control gate and on a substrate. The EEPROM cell of this type is disclosed in U.S. Pat. No. 4,998,220.

FIG. 3C illustrates still another conventional EEPROM cell having three layers of polysilicon, thereby including an erasing gate. That is, three polysilicon layers form a control gate 37, a floating gate 38 and an erasing gate 39. The erasing gate 39 which is formed by a third polysilicon layer is provided on an isolated region which is a field oxide layer 40 formed on a split type cell structure (this is disclosed in U.S. Pat. No. 5,070,032, in particular FIG. 2B thereof). Another type is constituted as follows. An erasing gate is formed between a floating gate and a field oxide layer by utilizing a first polysilicon layer, and the floating gate and a control gate are formed from the second and third polysilicon layers (this is described in International Electron Devices Meeting (IEDM) Technical Digest, December 1984, pages 464–467).

Programming such an EEPROM and erasing a programmed data from the EEPROM are carried out in the following manner.

First, a programming operation, i.e., recording data into the EEPROM having the simple stacked type gate as in FIG. 3A, is carried out in the following manner. That is, a positive voltage, which is significantly higher than the usual voltage, is supplied to the control gate and drain. Thus, hot electrons are formed in the channel near the drain. Some hot electrons are injected into the floating gate by the positive voltage induced in the floating gate, thereby the programming is carried out.

Meanwhile, an erasing operation is carried out in the following manner. A positive voltage is supplied to the

2 source, and the control gate is grounded. Then owing to the electric field between the floating gate and the source, the electrons which have been injected into the floating gate are tunneled through a thin tunneling oxide film toward the source, with the result that the recorded data are erased.

The operation of recording or erasing a data to and from the EEPROM cell which has floating gate and control gate which are disposed unevenly over the channel, as in FIG. 3B and unlike the simple stacked gate type, will be described. A programming operation is carried in the same manner as that of the simple stacked gate type EEPROM. An erasing is carried out by supplying a positive voltage to the drain instead of the source, so that an erasing would be done through an F-N tunneling between the floating gate and the drain.

Of these conventional techniques, the simple stacked gate type EEPROM as in FIG. 3A has the following problems: over-erasing occurring during an erasing operation; source junction breakdown due to a high voltage supplied to the source during an erasing operation; and quality deterioration of the gate oxide layer.

In the EEPROM in which the floating gate and the control gate are disposed unevenly with the channel as in FIG. 3B, there is a drain junction breakdown problem, and quality deterioration of the gate oxide layer.

In the structure as in FIG. 3C having the erasing gate, erasing is carried out through an F-N tunneling between the floating gate and the erasing gate, and therefore, the above mentioned problems are not seen. However, there are the following problems: three, rather than two, layers are required; the process of forming the poly structure with three layers is complicated; and the topology is aggravated.

SUMMARY OF THE INVENTION

The present invention is intended to overcome the above described disadvantages of the conventional techniques.

Therefore it is an object of the present invention to provide a flash EEPROM, cell structure thereof, and a method for the formation thereof, in which the processes of forming a control gate, a floating gate and an erasing gate are simplified, the topology of a substrate is improved, and the size of a cell is reduced.

The objects of the present invention are achieved by providing a method for forming an EEPROM cell, the method including the steps of: forming trenches in a substrate; forming a first insulating layer in the trenches; forming bit lines on the substrate between the trenches; forming a second insulating layer on the surface of the bit lines; forming a gate insulating layer on the substrate and extending partially into the trenches; forming floating gates on the gate insulating layer, the floating gates being (1) positioned between the trenches and (2) having a portion of a side contiguous with the second insulating layer; forming a third insulating layer on the floating gates; simultaneously forming a control gate and an erasing gate on the floating gate, the trench and the substrate; the control gate intersecting the bit lines and positioned on the floating gate and the substrate; and the erasing gate being positioned on the substrate, on the floating gate, and in the trenches.

The objects of the present invention are also fulfilled by providing an EEPROM comprising: a substrate; trenches in the substrate; a first insulating layer in the trenches; bit lines on the substrate located between the trenches; a second insulating layer on the bit lines; a gate insulating layer on the substrate extending partially into the trenches; floating gates on the gate insulating layer, the floating gates (1) being positioned between the trenches and (2) having a portion of a side contiguous with the second insulating layer; non-overlapping control gates and erasing gates; the control gates being located on the floating gates and the substrate; and the erasing gates being located on the floating gates, on the substrate, and in the trenches.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above object and other advantages of the present invention will become more apparent by describing in detail the preferred embodiment of the present invention with reference to the attached drawings in which:

FIGS. 1A and 1B are schematic views showing the layout of the EEPROM according to the present invention;

FIGS. 2A to 2E, 2F to 2J, and 2K to 2N together depict partly sectional views of the cell during the manufacturing process according to the present invention, in which;

FIGS. 2A to 2E are successive sectional views taken along a line 1—1' of FIGS. 1A–1B;

FIGS. 2F–2J are sectional views taken along a line 11—11'of FIG. 1A–1B; and

FIGS. 2K–2N are schematic three-quarter perspective views oriented as in FIG. 1A, showing cell portions by respective stages during manufacture according to the present invention.

DESCRIPTION OF THE PREFERRED EMBODIMENT

Figure 1A:
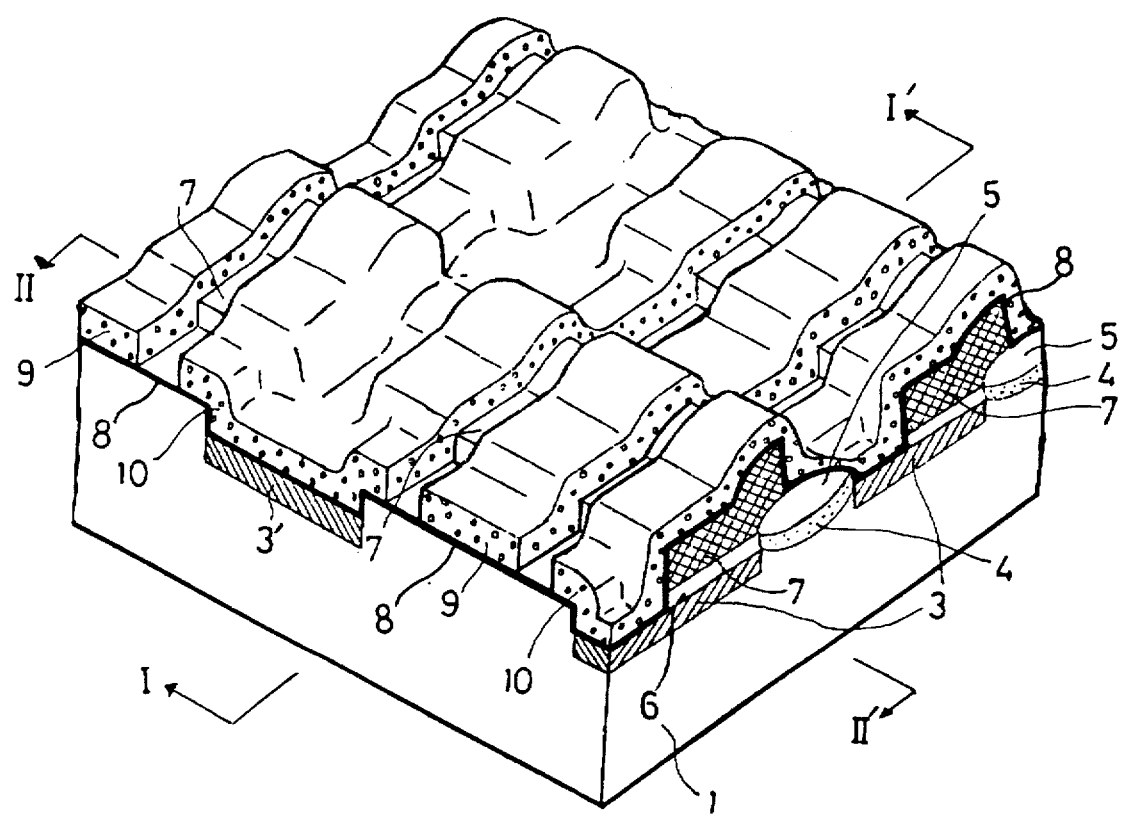

FIGS. 2A–2E, 2F–2J, and 2K–2N relate to FIGS. 1A and 1B as follows: FIGS. 2A to 2E are cross-sectional views along the line 1–1'; FIGS. 2F to 2J are cross-sectional views along the line 11–11; and FIGS. 2K–2N are three-quarter views oriented substantially the same as FIG. 1A. Further, these figures depict successive states of development in the manufacturing process for the EEPROM cell of the present invention. It is noted that FIG. 2F is a cross-sectional view that is perpendicular to both of the views in FIGS. 2A–2E and FIGS. 2F–2J. Also, FIG. 1B has a dashed box 16 that corresponds to the perimeter of the three-dimensional rectangular solid depicted in FIG. 1A, i.e., the dashed box 16 fixes the position of FIG. 1A within FIG. 1B.

Figure 2A:
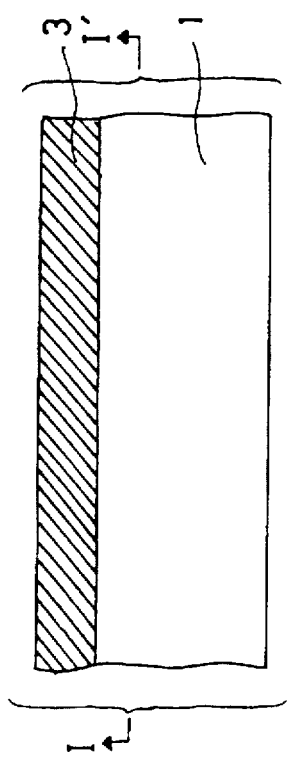
Figure 2B:
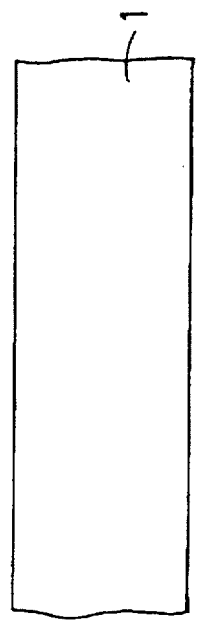
Figure 2C:
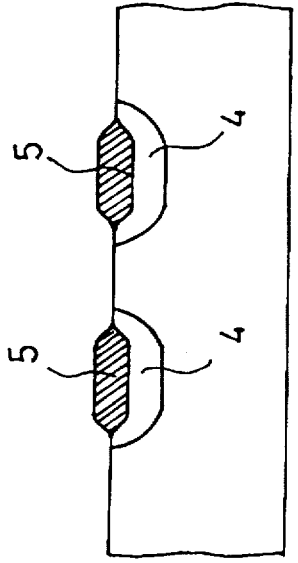
Figure 2D:
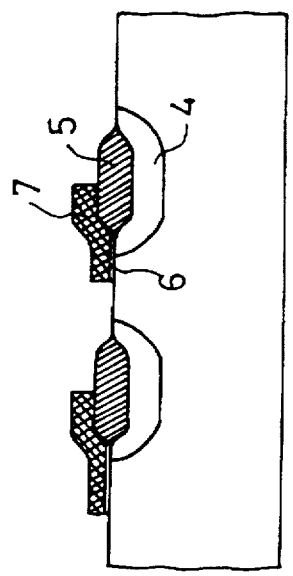
Figure 2E:
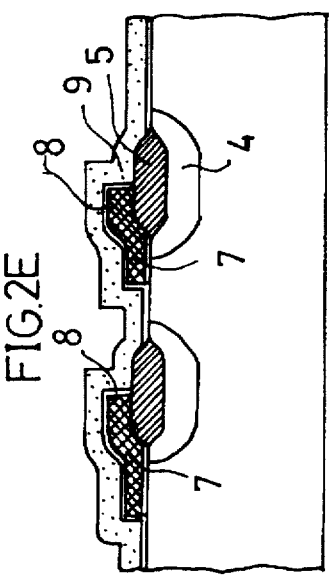
Figure 2F:
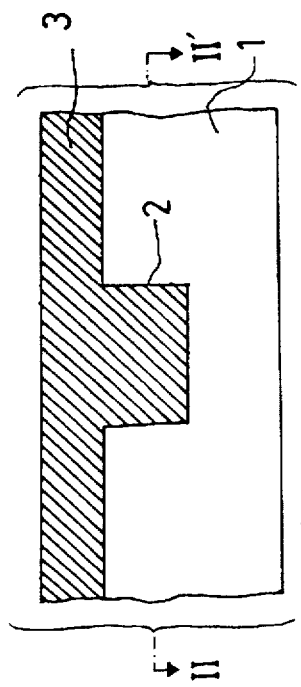
Figure 2I:
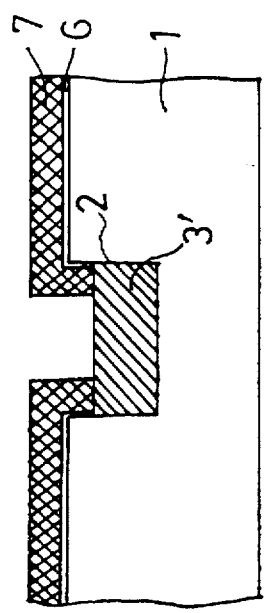
Figure 2J:
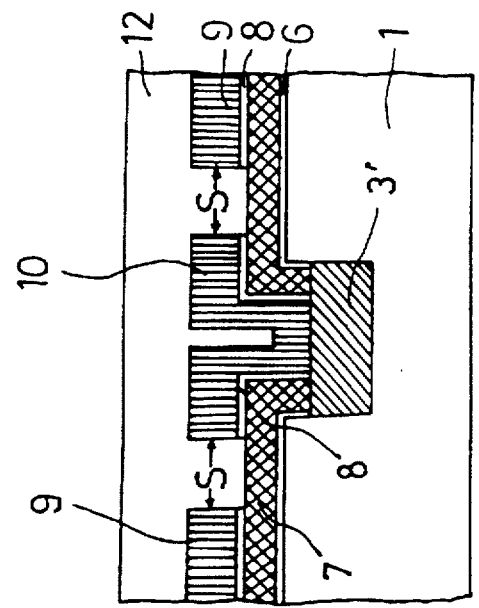
Figure 2G:
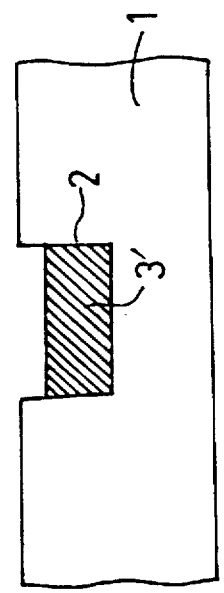
Figure 2H:
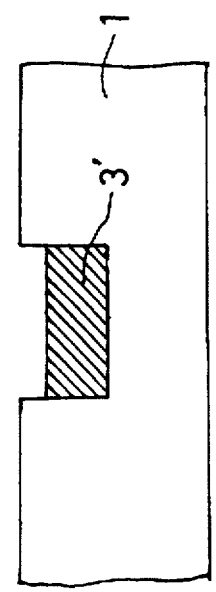
Figure 2K:
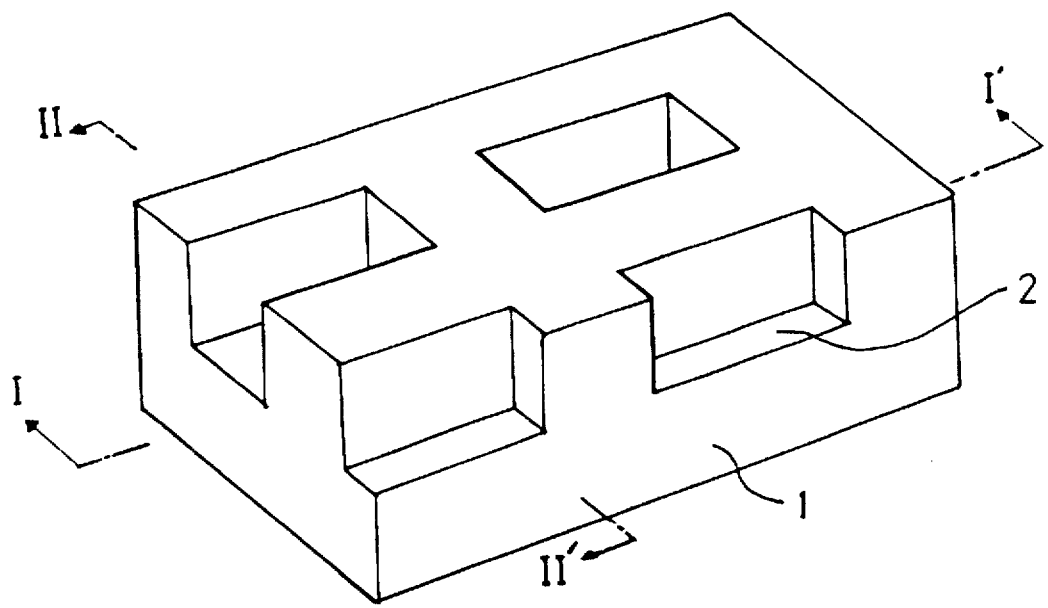

In the process of the present invention, first as shown in FIGS. 2A, 2F, and 2K, a predetermined region of a silicon substrate 1 is etched to form a trench 2 in the silicon substrate 1, and then, a silicon oxide layer or a silicon nitride layer as a first insulating layer 3 is deposited.

Figure 2L:
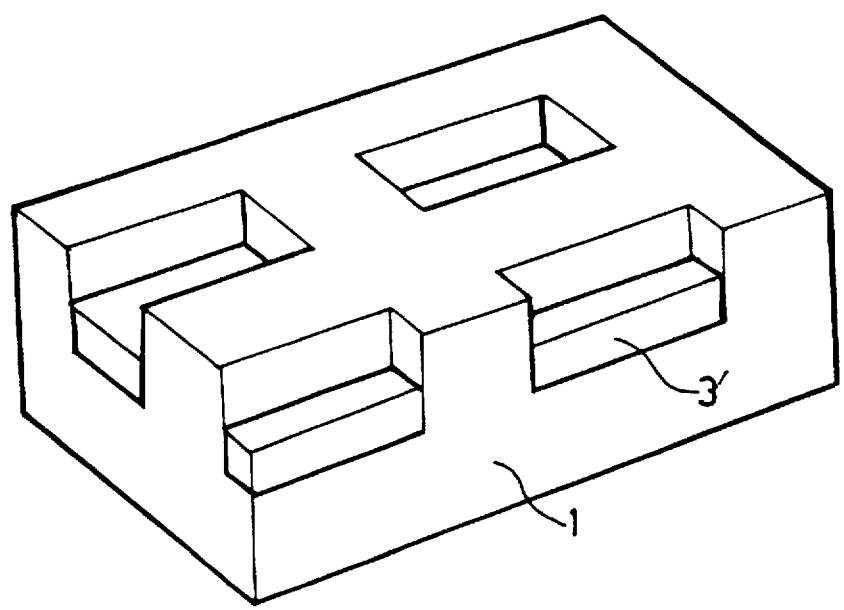
Figure 2M:
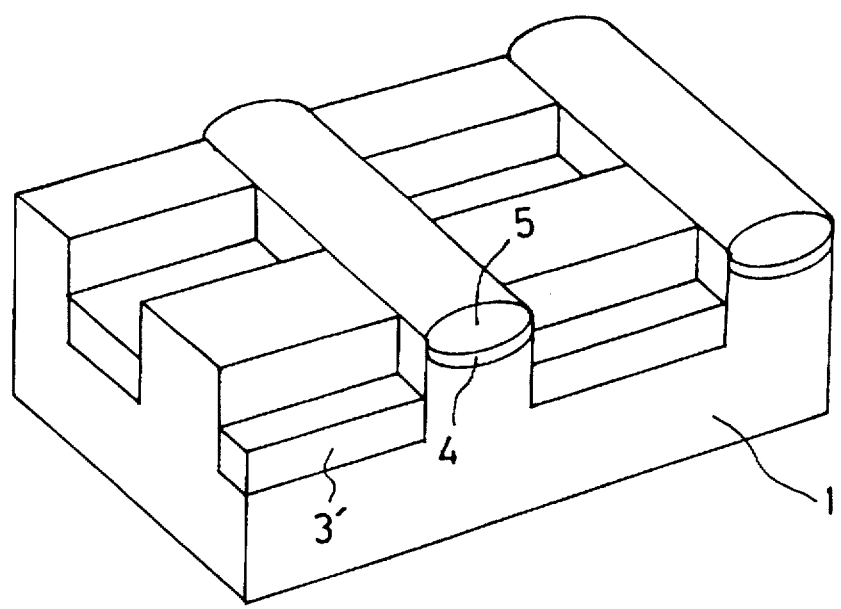

Then as shown in FIGS. 2B, 2G and 2L, the first insulating layer 3 is etched back to form an insulating layer 3' (the remains of layer 3) within the trench isolating region 2. The thickness of the first insulating layer 3' that remains in the trench is less than the depth of the trench 2.

The trench 2 having the first insulating layer 31 functions as an element isolating region, but also is a portion on which a floating gate 7 and an erasing gate 1 will be overlappingly formed. Further, the trench 2 will reinforce the electric field on a corner of the floating gate 7, and will improve the topology.

Then as shown in FIGS. 2C, 2H (which is the same as FIG. 2G because the change is occurring in the other cross-sectional view), and 2M, in order to form a source/drain region 4, which is utilized as a buried bit line, n type ions are ion-implanted into a relevant portion, and then, an upper part of the ion-implanted portion is oxidized so as to form a second insulating layer 5. This process is carried out in such a manner that a silicon oxide layer and a silicon nitride layer are deposited, and a portion of the nitride layer and the oxide layer are etched, in an area under which the source/drain region (bit line) 4 is to be formed, by applying a photo etching method. Then, an ion implanting process and oxidation process are carried out. Then bit lines 4 are formed as a buried layer, thereby improving the topology. In this way, a buried bit line layer 4 is formed under the second insulating layer (oxide layer) 5.

Figure 2N:
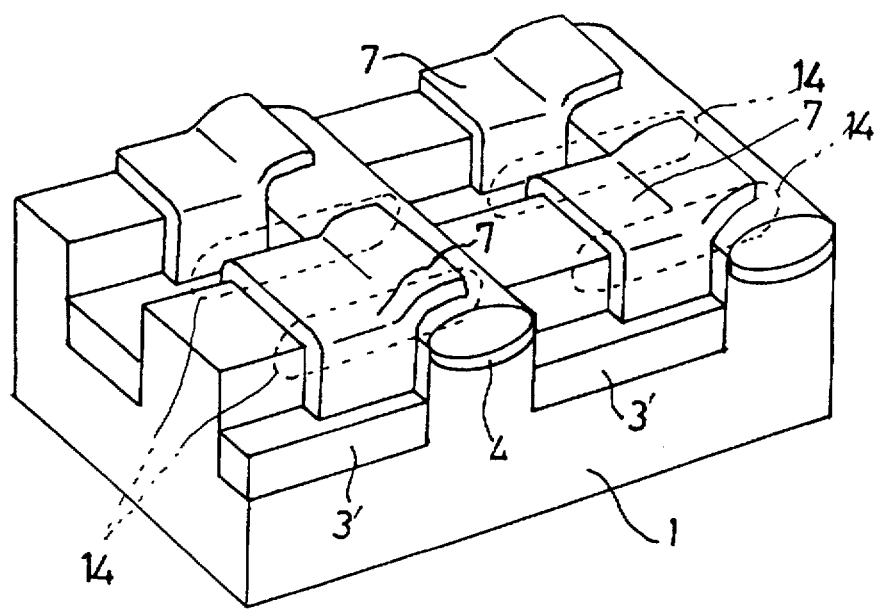

Then as shown in FIGS. 2D, 2I and 2N, a gate insulating layer 6 and a polysilicon layer are deposited, and a patterning is carried out by applying a photo etching method so as to form a floating gate 7 from the polysilicon layer.

Under this condition, a side of the floating gate 7 partially overlaps the buried bit line 4, which serves as a source and a drain. Also, a portion of the floating gate 7 extends down into the trench isolating region 2 to where the trench isolating region 2 is filled with the insulating layer 3'. As such, the corner portions 14 of the floating gates 7, along the line 11—11', are formed.

Then as shown in FIGS. 2E and 2J, a third insulating layer 8 is formed which will serve as an insulating layer between the floating gate 7 and the control gate 9, and between the floating gate 7 and the erasing gate 10. Thereupon, a polysilicon layer is deposited. Then a photo etching method is applied to pattern the polysilicon layer, thereby simultaneously forming the control gate 9 and the erasing gate 10. That is, with a single masking process, two gates are formed.

The gate insulating layer 6 and the third insulating layer 8 are formed of silicon oxide, but silicon nitride may be used instead of silicon oxide.

The polysilicon layers may be formed by depositing in-situ doped polysilicon, and the depositing method may be a known type.

In this structure thus formed, as shown in FIG. 1B, the control gate 9 crosses the source/drain buried bit line 4, and the corners of the control gate 9 along the line 11—11' are slightly separated from the trench isolating regions 2 by the two gaps, G.

The erasing gate 10 completely covers the trench isolating region 2, and is formed in the same direction as that of the control gate 9. There also is formed a space S between the control gate 9 and the erasing gate 10. It is noted that the gap, G, is larger than the space, S.

Thereafter, an insulating layer 12 is formed to cover the structure, and then, a finishing process is carried out in the normal manner.

As to the operation of the EEPROM according to the present invention, a programming is carried out in such a manner that a positive voltage is supplied to the drain and the control gate, so that hot electrons produced in the channel near the drain would be injected into the floating gate, thereby carrying out a recording of data.

An erasing is carried out in the following manner. A positive voltage is supplied to the erasing gate 10, and the control gate is grounded. Thus the electrons, which are injected into the floating gate 7 by the electric field which is formed between the floating gate 7 and the erasing gate 10, are ousted to the erasing gate 10 through F-N tunneling, thereby carrying out erasing. Under this condition, the most intense electric field is formed on the corner portion 14 of the floating gate 7 within the trench region 2, and therefore, the electrons can be tunneled through the mentioned portion, so that the erasing of data is easily accomplished.

Figure 3A:
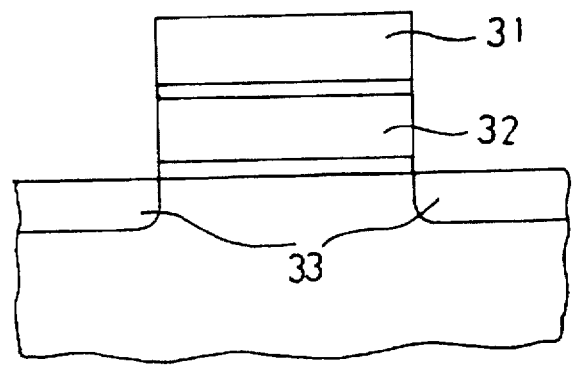
FIGS. 3A–3C illustrate aspects of a conventional EEPROM.
Figure 3B:
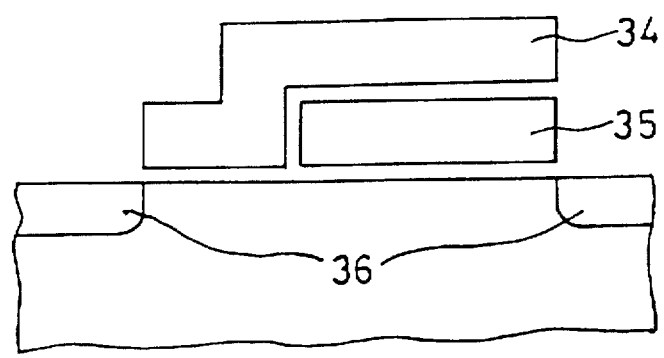

Compared with the conventional EEPROM such as FIG. 3A, the EEPROM according to the present invention has an improved reliability over the simple stacked gate type, because it utilizes the erasing gate.

Figure 3C:
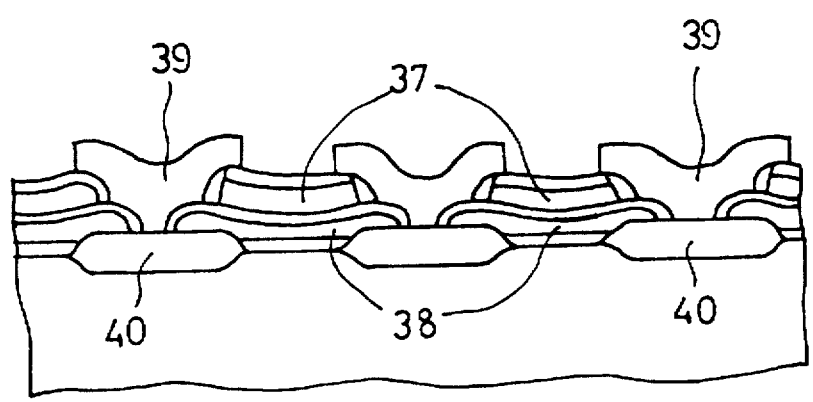

Meanwhile, if the EEPROM of the present invention is compared with the conventional EEPROM having an erasing gate such as FIG. 3C, the process is simplified (requiring only two layers instead of three), and the topology is improved (because, for example, the control gates and erasing gates are non-overlapping) in the present invention. Further, the erasing gate is formed on the trench isolating region, so that the active region does not receive interference during an erasing operation, and the cell area can be reduced relative to the conventional EEPROM in which the erasing gate is formed in the active region, e.g. 39 of FIG. 3C.

Further, owing to the structural characteristics, the electric field is focused on the corner portion 14 of the floating gate, and, by this effect, the erasing efficiency can be improved.

In an overall view, the structure is superior, and the process problems are solved, with the result that advantages are obtained compared with the conventional simple stacked gate type EEPROM, and the conventional split gate type EEPROM.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrically erasable programmable read only memory (EEPROM) having a plurality of cells, the EEPROM comprising:

a substrate having trenches therein;

a first insulating layer in the trenches;

impurity regions on the substrate located between the trenches;

second insulating layers on the impurity regions, respectively;

a gate insulating layer adjacent to the impurity regions and formed on the substrate extending partially into the trenches over the first insulating layer;

first gates on the gate insulating layer, the first gates: being positioned between the trenches; and having a portion of a side contiguous with the second insulating layers so as to partially overlap said impurity regions, respectively;

non-overlapping second gates and third gates, there being a second gate and at least one third gate for each given first gate, said second gates not overlapping said third gates;

the second gates being located over the substrate and being located so as to cross over the first gates, respectively; and the third gates being located over the substrate, over the trenches, between the second gates, and being located so as to cross over the first gates.

2. An EEPROM as in claim 1, wherein the thickness of the first insulating layer is less than or equal to the depth of the trenches.

3. An EEPROM as in claim 1, wherein said first gates and said gate insulating layer extend down into said trenches, respectively.

4. An EEPROM as in claim 1, wherein the thickness of the first insulating layer is less than the depth of the trenches.

5. An EEPROM as in claim 1, wherein the third gates are partially located in said trenches.

6. An EEPROM as in claim 1, wherein said impurity regions are bit lines, said first gates are floating gates, said second gates are control gates and said third gates are erasing gates.

7. An EEPROM as in claim 6, wherein the floating gates, the control gates, and the erasing gates are polysilicon.

8. An EEPROM as in claim 6, wherein the control gates are parallel to the erasing gates.

9. An EEPROM as in claim 6, wherein the bit lines are parallel to the floating gates and are perpendicular to the control gates and the erasing gates.

* * * * *